United States Patent

Daly

[15] 3,679,942

[45] July 25, 1972

[54] METAL-OXIDE-METAL, THIN-FILM CAPACITORS AND METHOD OF MAKING SAME

[72] Inventor: Francis Patrick Daly, Warwick, R.I.

[73] Assignee: RCA Corporation

[22] Filed: Feb. 9, 1971

[21] Appl. No.: 113,973

[52] U.S. Cl. ..............................317/230, 317/261, 29/25.42
[51] Int. Cl. ........................................................H01g 3/075
[58] Field of Search .........................317/230, 231, 233, 261; 29/25.42, 570

[56] References Cited

UNITED STATES PATENTS

| | | | |
|---|---|---|---|
| 2,398,176 | 4/1946 | Deyrup | 29/25.42 |
| 2,734,478 | 2/1956 | Reynolds et al. | 317/258 X |
| 3,139,568 | 6/1964 | Ishikawa et al. | 317/230 |
| 3,273,033 | 9/1966 | Rossmeisl | 317/261 |
| 3,397,446 | 8/1968 | Sharp | 29/570 |

*Primary Examiner*—James D. Kallam
*Attorney*—Glenn H. Bruestle

[57] ABSTRACT

In the manufacture of a metal-oxide-metal (MOM) thin-film capacitor, the layer of dielectric material, such as silicon dioxide, is deposited, by thermal decomposition of a silicon compound, over a conductive ground plate; and the Q factor (or quality factor) of the capacitor is enhanced and the dissipation factor of the silicon dioxide is reduced by low-temperature densification of the silicon dioxide.

5 Claims, 2 Drawing Figures

INVENTOR.
Francis P. Daly
BY
W. S. Hill
AGENT

METAL-OXIDE-METAL, THIN-FILM CAPACITORS AND METHOD OF MAKING SAME

BACKGROUND OF THE INVENTION

DESCRIPTION OF THE PRIOR ART

In the past, metal-oxide-metal, thin-film capacitors have been produced without an oxide densification step, as generally densification procedures were conducted under high-temperature, short-time conditions which caused undesirable intermixing of the metal and oxide layers. MOM capacitors formed with dielectric of silicon dioxide applied by standard techniques (without densification) produce undesirably high resistances. In thin-film circuits, especially those in low frequency range, such resistances cannot be tolerated. Thus, it became common practice to devote such circuits to active element; e.g., thin-film transistors, diodes, etc. Also, the state-of-the-art of thin-film capacitors led designers of integrated circuits (IC's) to include more active and fewer passive elements than they would normally include in the discrete version of the same circuit. Consequently, it was highly desirable that a thin-film capacitor be developed having a much greater Q factor than was previously available so as to overcome some of the resistance limitation problems. The new, Q capacitors discussed herein provide a component for the high frequency range IC without the concomitant high resistance.

Densification of silicon dioxide deposited by thermal decomposition of silicon compounds has been used in the past to provide semiconductor devices formed by a silicon-on-sapphire deposition step with the passivation characteristics approaching that of thermally grown silicon dioxide. Some of the work in this area was conducted by Lehman et al., U.S. Pat. No. 3,243,314, issued on Mar. 29, 1966. This patent describes a high-temperature method of silicon dioxide densification conducted in the range of 800° to 1000° C. More recently, a detailed study of silicon dioxide films was conducted by S. Krongelb and published in a paper entitled "Environmental Effects on Chemically Vapor-Plated Silicon Dioxide," Electrochemical Technology, Volume 6, pp. 251–266 (1968). Here Krongelb studied $SiO_2$ deposited on germanium by the decomposition of tetraethyl orthosilicate in the presence of oxygen.

SUMMARY OF THE INVENTION

This invention is a high Q, metal-oxide-metal, thin-film capacitor and a method for making same. The capacitor is formed on an insulating substrate on which a layer of conductive material is deposited so as to form an electrode region. Upon this conductive material, a layer of silicon dioxide is placed and the densification of this oxide layer is accomplished under a wet gaseous atmosphere using such gases as nitrogen or forming gas, at a surface temperature of from 395° to 425° C. for a period of at least 6 hours. This densification results in a silicon dioxide layer having a dielectric constant of approximately 4.2 as compared to a dielectric constant of approximately 4.5 before densification. After this densification, the second electrode is formed thereupon. The densification has a desirable effect on the Q factor.

The term "densified silicon dioxide" as used herein connotes that silicon dioxide to which there has been sufficient thermal energy applied so as to rearrange the OH-weakened silica network into a tighter structure.

It is an object of the invention to provide an improved method of producing MOM thin-film capacitors having a high Q factor. Another object of the invention is to provide an improved method of densifying the silicon dioxide layer deposited on the metal portion of a metal-oxide-metal, thin-film capacitor.

DESCRIPTION OF THE PREFERRED EMBODIMENTS

Figure 1:
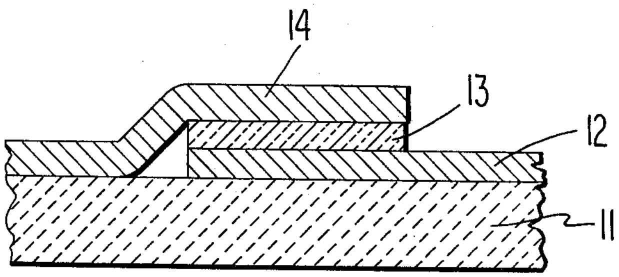
FIG. 1 is a cross-sectional drawing of a thin film capacitor of the present invention; and, FIG. 2 is a flow diagram of the various steps in making a capacitor in accordance with the present invention.

The high-Q, metal-oxide-metal capacitor that is the subject of this invention is formed in an integrated circuit (not shown) in the following manner. On a suitable substrate 11 (FIG. 1), which may typically by sapphire, magnesium-aluminate spinel, or a silicon wafer, a layer of conductive material 12 is deposited. The layer 12, which constitutes the lower electrode of the capacitor, is typically a metal or alloy such as aluminum, chrome-gold-chrome, or tungsten; and upon the electrode 12, a dielectric layer 13 is formed. This dielectric layer 13 is formed by standard techniques using either silane or tetraethyl orthosilicate, and oxygen for deposition of silicon dioxide. The dielectric layer 13 is then densified at low temperatures by the technique described in detail below and afterward a second electrode 14 is formed upon the dielectric layer 13 in a manner and from materials similar to the formation of the first electrode 12.

Figure 2:
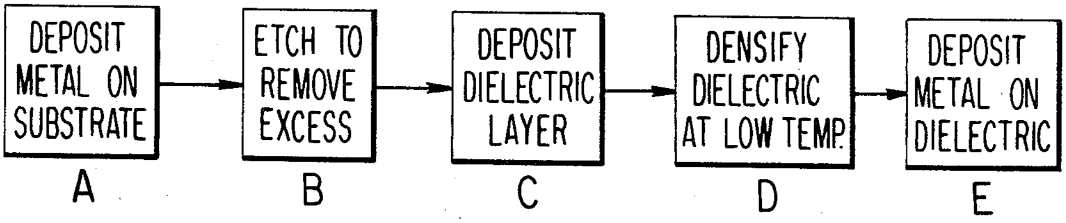

FIG. 2 is a flow chart diagram showing the basic steps which may be used in producing a thin-film capacitor or multiples thereof. Metal or a structure of metal layers is deposited upon a substrate (Block A) and a portion of this metal is etched to remove unwanted portions (Block B) to define the specific configurations of the capacitor. This etching step may include the masking of the deposited metal layer with a etch-resistant metal mask, wax or a photoresistant polymer and exposed to light-through the mask to define a desired configuration. Then the dielectric layer (Bock C) is deposited by standard silicon dioxide deposition techniques such as the reaction of silane, $SiH_4$, with oxygen. The dielectric layer is then densified (Block D) by a process described in detail below. The dielectric layer is then dried.

In Block E, the step of depositing an electrode is designated, this electrode being the second electrode of the capacitor, the metal layer first deposited being the other electrode. These steps A through F are the basic steps by which two metallic electrodes and the densified dielectric therebetween are formed. Other processing steps well known in the art may be included with the basic steps to provide a finished capacitor.

The densification of silicon dioxide is accomplished by the passage of nitrogen saturated with water vapor at a temperature of 85° C. over the silicon dioxide which is held at a surface temperature of 395° to 425° C. Most of the densification is completed by holding the capacitor under these conditions for at least 6 hours.

The densification of the silicon dioxide may be evaluated by any one or more of the following three techniques; namely, the measurement of the etch rate, the determination infrared absorption characteristics, and/or the determination of the dielectric constant.

It had previously been established that thermally grown silicon dioxide of good quality has an etch rate of 16.6A./sec. in a buffered HF etch (72g, HF; 200g, $NH_4F$; and 300g, $H_2$) at 21° C. The densification of silicon dioxide produced by low-temperature treatment is evidenced by a decrease in the etch rate of the densified oxide. The average etch rate of the densified oxide is 50 percent of the nondensified oxide etch rate as shown in the following table:

TABLE 1

| Run No. | Substrate | Ambient | Etch Rate Densified | Nondensified |
|---|---|---|---|---|
| | | | (A/sec) | (A/sec) |
| 1 | Si | wet $N_2$ | 61.9 | 115.0 |
| | | | 57.6 | 115.0 |
| 2 | Al | wet $N_2$ | 62.0 | 115.4 |
| 3 | Al | wet $N_2$ | 88.4 | 128.5 |
| 4 | Al | wet $N_2$ | 88.8 | 144.4 |
| 5 | Al | air | 118.7 | 128.5 |

(1) Oxide deposited at 300°C rather than 400°C (2) Densified for 5½ hours rather than 6 hours Such etch rates may be measured by determining the oxide thickness by taking reflectivity (interferometry, etc.) readings with a Beckman IR DB–G spectrophotometer at several time intervals.

The evaluation of oxide density by noting the absorption of the Si—O stretching band in the 9$\mu$ region is based on the phenomenon that this occurs at a higher frequency for densified silicon dioxide than for nondensified silicon dioxide. The peak that is observed at the higher frequency indicates a shorter atomic distance between the Si and O, thus verifying more dense silicon dioxide. Other determinations of infrared absorption characteristics involve measurements in the 3$\mu$ region which are indicative of hydroxyl ion content in the silicon dioxide film. Such also indicate that additional water is not introduced into the silicon dioxide film by densification under wet nitrogen.

The dielectric constant (K) of the silicon dioxide is determined by the actual measurement of an MOM capacitor of known conductor area and dielectric thickness, where:

$$C=0.224\,(KA/d)$$

for a capacitor of area A in square inches and dielectric thickness d in inches when the capacitance is expressed in picofarads. The dielectric constant for nondensified silicon dioxide produced by thermal decomposition of silicon compounds is considered to be about 4.5. The same measurement for densified $SiO_2$ is found to be about 4.2; and for thermally grown $SiO_2$ around 3.9. As this decrease cannot solely be accounted for by a loss of trapped water molecules in the silicon dioxide, the lower dielectric constant is a result of a change in the structure of the silicon dioxide. This change in dielectric constant is identifiable as reduced stain in the structure as evaluated in the previously described technique and thus is also indicative of a more densified material.

In addition to the aforementioned evaluation techniques, the effective Q of the capacitor at microwave frequencies may be obtained through slotted line measurement. Q values for densified v. nondensified oxide at certain capacitance values are given in the following table:

TABLE 2

Nondensified $SiO_2$

| Resistance (ohms) | Capacitance (pf) | Q | Frequency (MHz) |
|---|---|---|---|
| 1.78 | 3.21 | 18 | 1500 |
| 1.67 | 3.16 | 20 | 1500 |
| 2.66 | 2.46 | 16 | 1500 |
| 1.89 | 5.47 | 10 | 1500 |
| 1.42 | 10.64 | 7 | 1500 |

Densified $SiO_2$

| Resistance (ohms) | Capacitance (pf) | Q | Frequency (MHz) |
|---|---|---|---|
| 0.44 | 1.91 | 126 | 1500 |
| 0.24 | 3.97 | 111 | 1500 |
| 0.48 | 4.57 | 48 | 1500 |
| 0.35 | 4.54 | 67 | 1500 |
| 0.26 | 15.46 | 26 | 1500 |
| 0.48 | 4.47 | 49 | 1500 |

Thermal $SiO_2$

| Resistance (ohms) | Capacitance (pf) | Q | Frequency (MHz) |
|---|---|---|---|
| 0.43 | 2.08 | 119 | 1500 |
| 0.52 | 2.13 | 95 | 1500 |
| 0.38 | 3.30 | 85 | 1500 |
| 0.36 | 3.26 | 90 | 1500 |
| 0.60 | 6.17 | 29 | 1500 |
| 0.44 | 5.86 | 41 | 1500 |

The maximum oxide thickness that could be densified on a glass-aluminum substrate without the oxide cracking was a 5,000A. layer of silicon dioxide deposited at 400° C. The major reason for this oxide cracking is the coefficient of thermal expansion mismatch between electrode and silicon dioxide; e.g., aluminum of 25 × $10^{-6}$ and silicon dioxide of 0.05 to $10^{-6}$. Also, if the temperature exceeds 425° C., a 5,000 A. layer of silicon dioxide will also crack.

Although the present invention has been shown and illustrated in terms of a specifically preferred embodiment, it is apparent that changes and modifications are possible without departing from the spirit and description of the invention as defined in the appended claims.

I claim:

1. A high-Q, metal-oxide-metal, thin-film capacitor comprising:
an insulating substrate;
a first layer of conductive material forming a first electrode region on said insulating substrate;
a second layer of densified silicon dioxide covering at least a portion of the first layer and forming the oxide dielectric of said capacitor; and
a third layer of a conductive material forming a second electrode region on top of said second layer.

2. The high-Q, metal-oxide-metal capacitor according to claim 1, wherein
said silicon dioxide layer has a dielectric constant of less than 4.5.

3. The high-Q, metal-oxide-metal capacitor according to claim 1, wherein
said conductive material forming the electrode regions is selected from the group consisting of aluminum, tungsten, chrome-gold-chrome, and chrome-copper-chrome.

4. A method of making metal-oxide-metal, thin-film capacitors on a surface of an insulating substrate comprising the steps of:
depositing a first electrode on said surface;
forming a silicon dioxide layer on a portion of said first electrode;
densifying said silicon dioxide layer by exposing said substrate, said electrode, and said silicon dioxide layer to a relatively inert, wet gaseous atmosphere while holding said substrate, said electrode, ad said silicon dioxide layer at a surface temperature of from 395° to 425° C. for a period of at least six hours; and,
depositing a second electrode on said silicon dioxide layer to form said capacitor.

5. A method of making metal-oxide-metal, thin-film capacitors as defined in claim 4, wherein
said conductive material forming the electrode region is selected from the group consisting of aluminum, tungsten, chrome-gold-chrome, and chrome-copper-chrome.

* * * * *

UNITED STATES PATENT OFFICE
CERTIFICATE OF CORRECTION

Patent No. 3,679,942 Dated June 25, 1972

Inventor(s) Francis Patrick Daly

It is certified that error appears in the above-identified patent and that said Letters Patent are hereby corrected as shown below:

IN THE SPECIFICATION:

Column 1, line 26: after "new," insert ---high---.

Column 2, line 52: after "determination" insert ---of---.

Column 2, line 57: "$H_2$" should be ---$H_2O$---.

Column 3, line 19: after "Such" insert ---measurements---.

IN THE CLAIMS:

Claim 4, line 56: "ad" should be ---and---.

Signed and sealed this 8th day of May 1973.

(SEAL)
Attest:

EDWARD M.FLETCHER,JR.
Attesting Officer

ROBERT GOTTSCHALK
Commissioner of Patents

Disclaimer

3,679,942.—*Francis Patrick Daly*, Warwick, R.I. METAL-OXIDE-METAL, THIN-FILM CAPACITORS AND METHOD OF MAKING SAME. Patent dated July 25, 1972. Disclaimer filed Oct. 30, 1972, by the assignee, *RCA Corporation*.

Hereby enters this disclaimer to claims 1, 2 and 3 of said patent.

[*Official Gazette December 24, 1974.*]